United States Patent [19]

Robinson et al.

[11] 4,308,756

[45] Jan. 5, 1982

[54] VACUUM SAMPLE INTRODUCTION UNIT

[75] Inventors: James E. Robinson, Burlington; Aniket Pant, Toronto; Roger C. Legg, Burlington, all of Canada

[73] Assignee: Ultra High Vacuum Instruments Ltd., Burlington, Canada

[21] Appl. No.: 162,580

[22] Filed: Jun. 23, 1980

[30] Foreign Application Priority Data

Oct. 4, 1979 [GB] United Kingdom .............. 34438/79

[51] Int. Cl.³ .............................................. G01N 1/00
[52] U.S. Cl. .............................. 73/863.85; 73/864.82; 414/217
[58] Field of Search ........... 73/863.85, 864.81, 864.82, 73/864.83; 250/288; 414/217, 219, 221, 222

[56]        References Cited
        U.S. PATENT DOCUMENTS 2,760,655  8/1956  Foskuhl ........................... 73/864.82
3,340,176  9/1967  Belluso et al. .................... 414/217
3,590,243  6/1971  Perrin ............................. 250/288

Primary Examiner—S. Clement Swisher
Attorney, Agent, or Firm—Sim & McBurney

[57]    ABSTRACT

A sample loading device for loading samples into and unloading samples from an ultra high vacuum analysis chamber without the necessity to raise and lower pressure each time a sample loading or unloading is effected, is described. The sample is initially positioned in a chamber of comparatively small volume which can be rapidly and simply evacuated to a vacuum approximating that of the analysis chamber. A gate valve between the small volume chamber and the analysis chamber then is opened and the sample introduced to the analysis chamber by a simple rack-and-pinion mechanism. Fine positioning of the sample and release of the carrier from the insertion fork is achieved by external X- and Y-axis adjustments.

9 Claims, 7 Drawing Figures

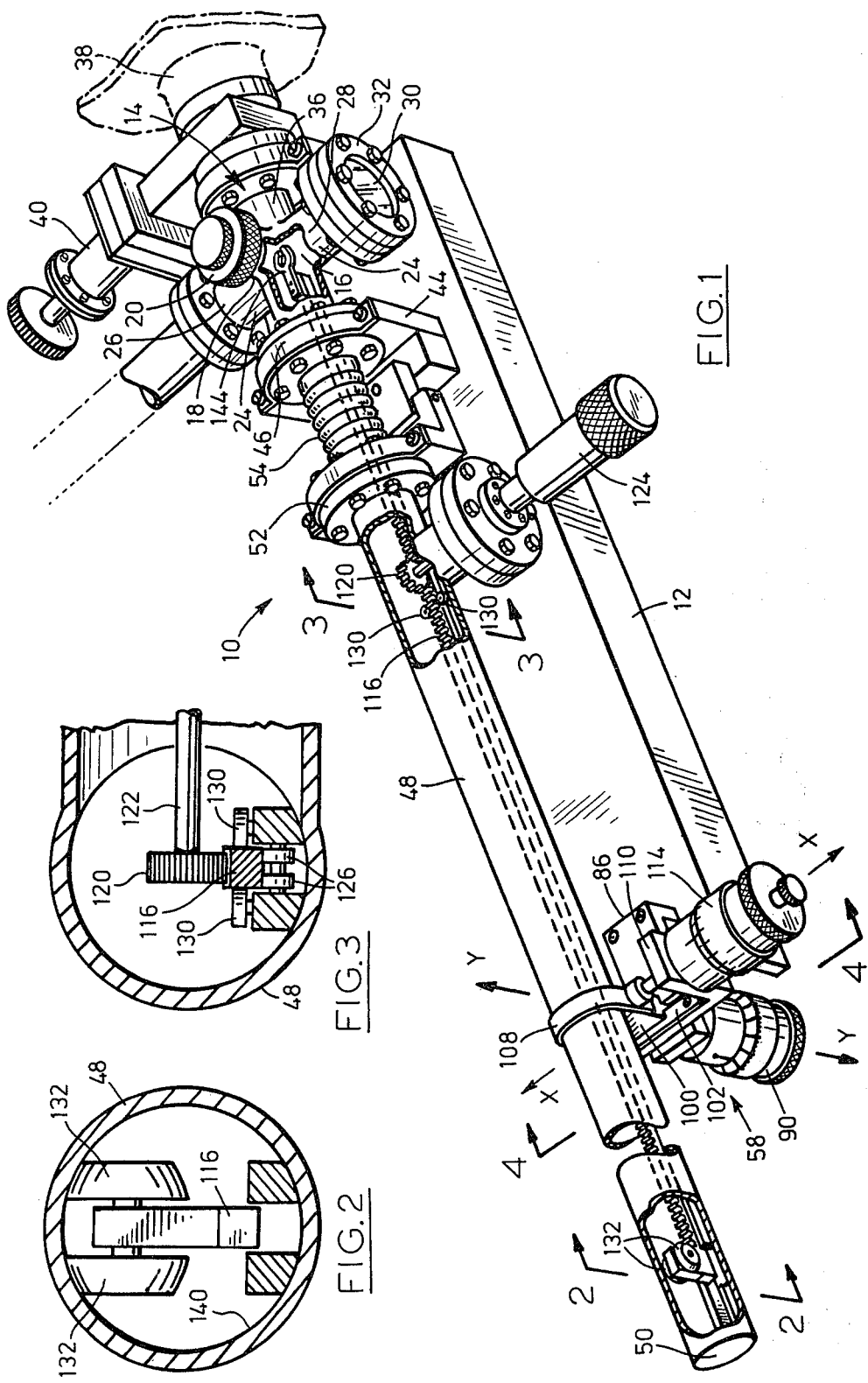

VACUUM SAMPLE INTRODUCTION UNIT

FIELD OF INVENTION

The present invention is directed to a vacuum sample introduction device, and in particular to a device for transferring sample holders or special samples into a high vacuum environment without the necessity for venting the main current chamber to atmosphere.

BACKGROUND TO THE INVENTION

Vacuum sample introduction devices currently available for transferring samples into an ultra high vacuum environment for analysis involve somewhat complex and sophistocated techniques and mechanisms and hence are relatively expensive.

SUMMARY OF THE INVENTION

The vacuum sample loading device of this invention much simplifies the transfer mechanism and provides a relatively inexpensive, and yet reliable, device. In this invention, a sample carrier bearing a sample for analysis first is loaded onto a carrying fork through a port in an intermediate vacuum chamber while the loading device is isolated from the ultra high vacuum analysis chamber. Following closure of the sample introduction port, the intermediate chamber is pumped down to the ultra high vacuum range (less than $10^{-6}$ mm of mercury). An air lock valve located between the loading chamber and the main ultra high vacuum analysis chamber when is opened to establish communication between the chambers and the sample carrier is transferred to the main chamber. The loading fork may be manipulated to a position to deposit the sample carrier at any desired location. After so positioning the sample carrier, the loading fork may be retracted from the analysis chamber and the air lock again closed.

BRIEF DESCRIPTION OF DRAWINGS

FIG. 1 is a perspective view of a vacuum sample introduction device constructed in accordance with one embodiment of the invention;

FIG. 2 is a sectional view taken on line 2—2 of FIG. 1;

FIG. 3 is a sectional view taken on line 3—3 of FIG. 1;

DESCRIPTION OF PREFERRED EMBODIMENT

Figure 4:
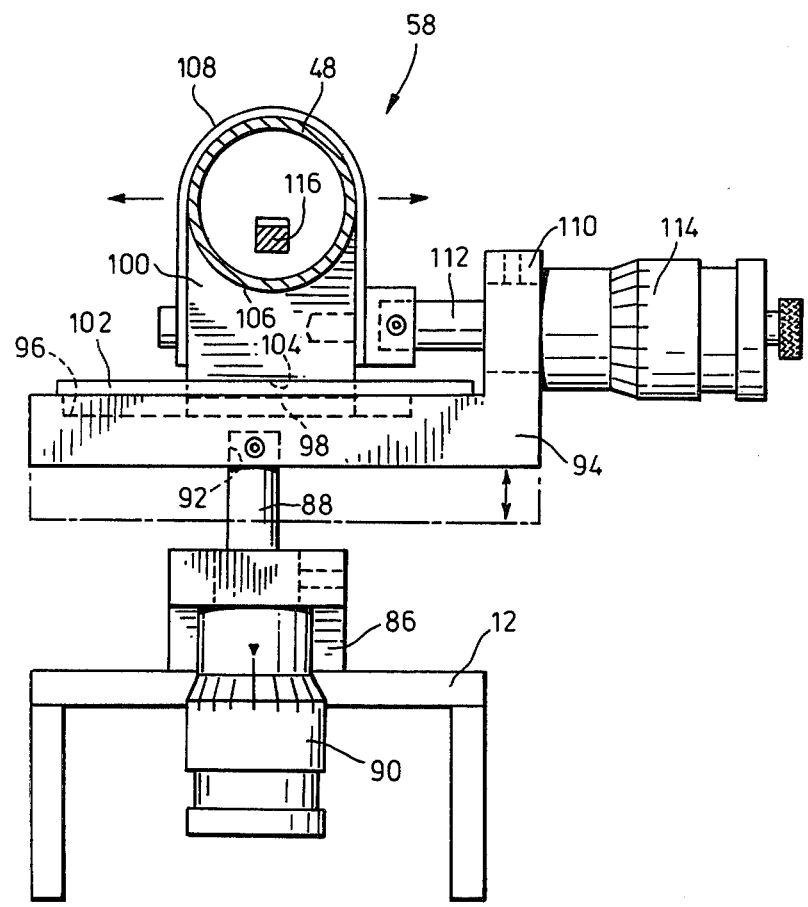
FIG. 4 is a sectional view taken on line 4—4 of FIG. 1.

Referring to the drawings, a vacuum sample introduction unit 10 includes an elongate rigid mounting frame 12 supporting the various elements of the unit 10 described below. A stationary housing 14 encloses a vacuum chamber 16 and is fixedly mounted at one end of the frame 12. The housing 14 takes the form of a 5-way cross which includes an upwardly-directed sample loading port 18 normally closed by closure cap 20 but openable for insertion of a sample carrier 22 into the chamber 16 and for removal of a sample carrier 22 therefrom.

The housing 14 also includes a first pair of aligned ports extending transversely of the axis of the frame 12, one member 24 of the port pair being normally connected to a vacuum pump (not shown) while the other member 26 of the port pair is normally closed with a viewing window 28 provided in the closure 30.

The housing 14 further includes a second pair of aligned ports extending axially of the frame 12 perpendicularly to the axis of the first port pair 24, 26, one member 32 of the second port pair communicating with the ultra high vacuum analysis chamber 34 through gate valve 36, while the other member 38 of the second port pair communicates with the remainder of the device.

The housing 14 is mounted to the frame 12 on two spaced upright members 40 and 42 which respectively receive the flanges of the second port pair 38, 32 in port circular recesses therein. Port circular straps 44 mounted to the upright members 40 and 42 enclose the flanges to complete the mounting assembly.

An elongate hollow cylindrical housing 46 extends axially of the frame 12. The cylindrical housing 46 has a closed end 48 and an open end 50 which communicates with the vaccum chamber 16 through a bellows connector 52. The cylindrical housing 46 is connected to the housing 14 by a universal joint to pivot mechanism 54 which permits movement of the cylindrical housing 46 relative to the stationary housing 14. The cylindrical housing 46 is also mounted to the frame 12 at the opposite end of the frame 12 from the stationary housing 14 by a mounting mechanism 56 which is constructed to permit limited vertical and transverse movement (X- and Y-axis movement) of the cylindrical housing 46 relative to the frame 12 about the pivot mechanism 54.

The pivot mechanism 54 includes a stationary support block 58 mounted on the frame 12 and abutting the upright 42 and receiving a vertical pivot pin 60 therein. The pivot pin 60 passes through a horizontal plate 62 so that the plate 62 may pivot about a vertical axis relative to the support block 58.

The plate 62 also has a transverse opening 64 formed at the end thereof remote from the pivot pin 60. The transverse opening 64 receives a second pivot pin 66 therein. A generally U-shaped plate 68 also receives the pivot pin 66 through openings 70 in the arms 72 thereof.

The U-shaped plate 68 is integrally formed with an upright flange 74 which has a part-circular recess 76 therein for receiving the flange 78 at the open end 50 of the cylindrical housing 46, the mounting being completed by an encircling strap 80. The pivot pin 60 permits movement of the U-shaped plate 68 about a horizontal axis. The mounting of the cylindrical housing 46 to the flange 74 enables the cylindrical housing 46 to pivot about the Y-axis relative to the horizontal pivot pin 66 and to pivot about the X-axis relative to the vertical pivot pin 60.

The mechanism for effecting these movements is associated with the mounting mechanism 56. As may be seen in detail in the cross-sectional view of FIG. 4, a bracket 82 is fixedly mounted to the frame 12 and the shaft 84 of a vernier adjuster 86 passes through an opening in the horizontal portion of the bracket 82 into a recess 88 in a transversely extending plate 90, whereby actuation of the vernier adjuster 86 leads to up or down movement of the plate 90, depending on the direction of rotation of the vernier adjuster 86.

The horizontal plate 90 has an elongate slot 92 formed in the upper surface thereof and extending transversely relative to the frame 12. The lower end 94 of an upright support member 96 is received in sliding relation in the slot 92. To maintain the upright support member 96 located in the slot 92, a pair of plates 98, 100 are affixed to the plate 94 and extend into sliding relation with respective recesses 102, 104 formed in the side walls of the upright support member 96.

The upright support member 96 has a part-circular recess 106 in the upper surface thereof receiving the tubular member 46, the mounting of the tubular member 46 to the upright support member 96 being completed by an overlying strap 108.

The horizontal plate 90 supporting the upright member 96 in sliding relation thereto has an integral upright flange 110. The shaft 112 of a second vernier adjuster 114 extends through the flange 110 and into a recess 113 formed in a boss 115 mounted to the upright member 96. Actuation of the vernier adjuster 114 causes the upright member 96 to move towards the left-hand side or to the right-hand side (as viewed in FIG. 4), depending on the direction of rotation of the vernier adjuster 114.

The vernier adjuster 86, therefore, varies the vertical position of the cylindrical housing 46 relative to the frame 12 by pivoting action relative to the pivot pin 66 (i.e., Y-axis movement) while the vernier adjuster 114 varies the horizontal position of the cylindrical housing 46 relative to the frame 12 by pivoting action relative to the pivot pin 60 (i.e., X-axis movement).

Located within the cylindrical housing 46 for movement therein is an elongate rack 116 to which a sample transfer fork 118 is mounted. The rack 116 is dimensioned so that in its retracted position (as seen in FIG. 1), the transfer fork 118 is located within the vacuum chamber 16 in alignment with the sample loading port 18 for ease of support of sample holders 22 to be inserted into the vacuum analysis chamber 34 on the loading fork 118 and for ease of removal of sample holders 22 supported on the loading fork 118 from the vacuum chamber 16.

The rack 116 is driven in its longitudinal movement by an intermeshing pinion 120. The pinion 120 is fixedly mounted on an axle 122 which is rotatable in the desired direction by an external drive mechanism 124. The rack 116 is supportably mounted on rollers 126 which are journalled at two longitudinally-spaced locations in a stationary elongate rack support 128 fixedly mounted in the cylindrical housing 46.

In addition, two pairs of rollers 130 are mounted to the rack support 128 for rotation about vertical axes on each longitudinal side of the pinion 120 to provide horizontal location of the rack 116 in the cylindrical housing 46, so that proper relative locations of rack 116 and pinion 120 are maintained.

At the end of the rack 114 opposite to the sample holder 118 is provided a pair of upright rollers 132 journalled for rotation about an axle 134 located in a mounting 136. The rollers 132 have bevelled surfaces 138 for engagement with the inner wall 140 of the hollow cylindrical member 48, thereby providing support to the rack 116, especially when the latter is in its extended position.

Figure 6:
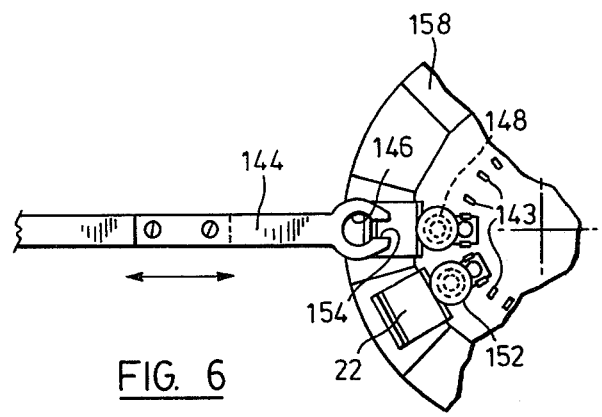
FIG. 6 is a plan view of the elevational view of FIG. 5.
Figure 5:
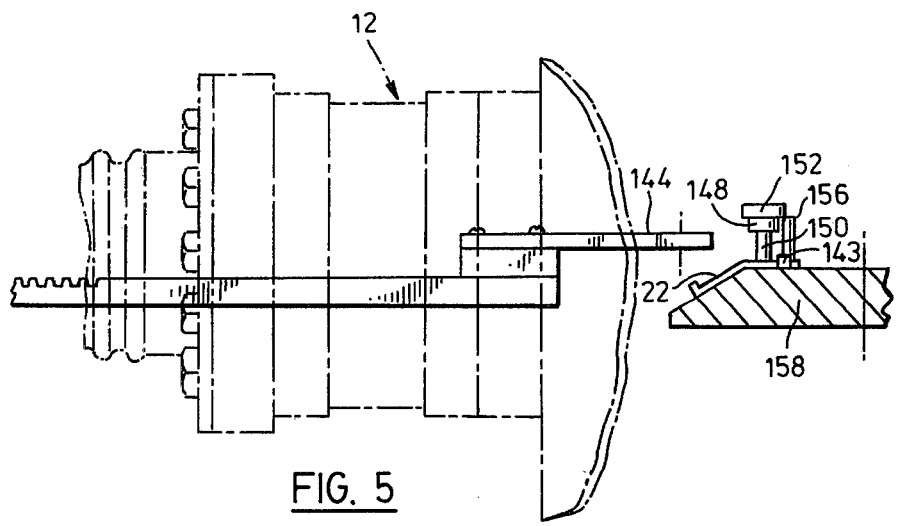
FIG. 5 is an elevational view showing the interrelationship of the sample holder and the sample located in the ultra high vacuum environment.
Figure 7:
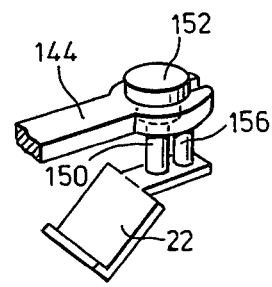
FIG. 7 is a perspective view showing a sample holder gripping the sample.

FIGS. 5 to 7 illustrate details of the sample transfer fork 118 and utilization thereof in conjunction with a sample holder 22 which is mounted on a conventional sample carrier carousel 142 by a spring clip 143. The sample transfer fork 118 includes a planar projection 144 having a circular opening 146 dimensioned to receive an enlarged collar portion 148 of a locating pin 150 on the sample holder 22. The enlarged collar portion 148 has a smaller diameter than the head 152 of the locating pin 150 of the sample holder 22.

A radial slot 154 communicates with the circular opening 146 of the transfer fork 118 and is dimensioned to receive the locating pin 150 therethrough. A second pin 156 is also provided on the sample holder 22 to engage the slot 154 when the sample holder 22 is located on the fork 144 to prevent rotation of the sample holder 22 relative to the transfer fork 118.

OPERATION

The operation of the loading device 10 for loading a sample into the ultra high vacuum analysis chamber 34 now will be described. The gate valve 36 is closed, so that the unit 10 is isolated from the ultra high vacuum analysis chamber 34, and the chamber 16 is at ambient atmosphere pressure. The rack 116 is in its fully retracted position with the loading fork 118 located in the chamber 16 immediately below the sample loading port 18.

The cap 20 is removed from the sample loading port 18 and the sample carrier 22 is mounted on the loading fork 118 with the enlarged collar 148 located in the opening 146 and the fork 144 abutting the underside of the head 152. The slot 154 receives the pin 156 to prevent relative rotation of sample carrier 22 and the fork 144.

When the cap 20 has been replaced on the sample loading port 18, a vacuum pump connected to the vacuum pumping port 24 is operated to evacuate the device 10 until a pressure in the ultra high vacuum range is reached. The gate valve 36 then is opened to establish communication between the analysis chamber 34 and the interior of the device 10. It is unnecessary for the vacuum in the device 10 to precisely match that of the analysis chamber 34 in view of the relatively small interior volume of the device 10 as compared with that of the analysis chamber 34.

The pinion-rotating knob 124 is rotated to cause the rack 116 to move along the interior of the tubular member 46 and thereby to move the fork 118 and attached sample carrier 22 from the chamber 16 to the analysis chamber 38. As seen in greater detail in FIGS. 5 and 6, the sample carrier 22 usually in desired to be positioned on a carousel 142 in the analysis chamber 38 for effecting desired analyses on a plurality of samples on the sample holders 22 held on the carousel 142 by the spring clip 143.

The X-axis and Y-axis positions of the fork 118 are adjusted to align the sample carrier 22 with a particular holding station on the carousel 142 by suitable manipulation of the X-axis vernier 114 and Y-axis vernier 114 and the Y-axis vernier 86. The sample carrier 22 then is pushed forward into the clip 143 at the relevant holding station by rotation of the pinion rotating knob 124. The Y-axis position of the fork 118 is adjusted by suitable manipulation of the Y-axis vernier 90 to release the projection 144 from the sample carrier 22 by lowering the front 118 so that the opening 146 is out of contact with the collar 148.

The pinion rotating knob 124 then is rotated in the reverse direction to retract the rack 116 into the housing 46 and hence to retract the fork 118 from the analysis chamber 38. The gate valve 36 is closed until a further sample carrier 22 needs to be introduced into or retracted from the analysis chamber 38.

The vacuum sample introduction device 10, therefore, permits the transfer of sample carriers 22 into and out of an ultra high vacuum environment without the necessity for pumping the environment down to the desired vacuum level each time a transfer is required. These transfers are achieved using relatively simple and inexpensive mechanisms.

The sample is initially positioned in a chamber of comparatively small volume which can be rapidly and simply evacuated to a vacuum approximating that of the ultra high vacuum environment into which the sample is to be introduced. A gate valve between the small volume chamber and the analysis chamber then is opened and the sample inserted into the analysis chamber by a simple rack-and-pinion mechanism. Fine positioning of the sample and release from the insertion device are achieved by external X-and Y-axis adjustments.

SUMMARY OF DISCLOSURE

In summary of this disclosure, the present invention provides a vacuum sample introduction device of unique construction which enables samples to be introduced to and removed from an ultra high vacuum environment in simple manner. Modifications are possible within the scope of the invention.

What is claim is:

1. A sample loading apparatus for loading samples into and unloading samples from an ultra high vacuum environment while maintaining the ultra high vacuum environment during such action, which comprises:

an elongate rigid frame member,
a housing member rigidly mounted on said frame member and having a hollow chamber defined therein,
selectively openable and normally closed sample introduction post means communicating with said chamber for the introduction of sample carrier means to and removal of sample carrier means from said chamber,
vaccum application port means communicating with said chamber for the application of vacuum to said chamber,
a pair of axially-aligned port means communicating with said chamber and extending generally axially of said frame member from opposite sides of said chamber,
a hollow tubular member extending generally axially of said frame member from a closed end to an open end communicating with one of said pair of axially-aligned port means said tubular member being mounted to said housing member for pivotal movement of said tubular member about a vertical axis and about a horizontal axis relative to said housing member,
means for effecting said pivotal movement of said tubular member about said horizontal axis,
means for effecting said pivotal movement of said tubular member about said vertical axis,
rack means slidably mounted in said tubular member and fixed location pinion means in said tubular member in operable engagement with said rack means for effecting longitudinal movement thereof,
actuation means located externally of said housing member for rotating said pinion means to effect said longitudinal movement of said rack means, and
sample transfer means located at one end of said rack means for receiving and supporting said sample carrier means,
said rack means being positioned to be movable between a first position wherein said rack means extends into said chamber through said one of said pair of axially-aligned port means to locate said sample transfer means in a position accessible to said sample introduction port means and a second position wherein said rack means extends through the chamber and out through the other of said pair of axially-aligned port means for effecting transfer to and from an ultra high vacuum environment.

2. The apparatus of claim 1 wherein said rack means is supported on first roller means located in said tubular member and has second roller means mounted thereto at the inner end thereof for rolling engagement with the inner wall of said tubular member during longitudinal movement of said rack means.

3. The apparatus of claim 2 wherein said first roller means are mounted in channel means having side walls at longitudinally-spaced locations therein and said rack means is supported on said first roller means between said channel side walls.

4. The apparatus of claim 3 wherein third roller means engage said rack means on both longitudinal sides of the location of said pinion means to locate said rack means between said channel side walls.

5. The apparatus of claim 1, 2, 3 or 4 wherein said sample transfer means includes an annular ring member having a central opening for receipt of a sample carrier and a radial opening to permit the carrier to pass therethrough into said ring member.

6. The apparatus of claim 1 wherein said tubular member is mounted to said frame member at the opposite end thereof from said housing member by adjustable-location mounting means, and each said means for effecting said pivotal movement is associated with said adjustable location mounting means.

7. The apparatus of claim 6 wherein said adjustable location mounting means includes a first upright plate member to which said tubular member is fixedly mounted, a second horizontal plate member in which said first plate member is mounted for sliding movement transverse to the axis of said frame member, a stationary member fixedly mounted to said frame member and to which said means for effecting said pivotal movement about said vertical axis is mounted for operable engagement with said second horizontal plate member, and a flange member upstanding from one side of said plate member and to which said means for effecting said pivotal movement about said horizontal axis is mounted for operable engagement with said first vertical plate member.

8. The apparatus of claim 7, wherein said tubular member is mounted to said housing member for pivotal movement of said tubular member about a vertical axis and about a horizontal axis relative to said housing member by a first upright plate member to which said housing member is mounted at said open end thereof, a generally U-shaped horizontally-extending member, a second horizontal plate member received at one end thereof between the arms of said U-shaped member, a first pivot pin extending through the arms of said U-shaped member and said one end of said horizontal plate member to establish a first pivot axis to accommodate said vertical axis movement, a third upright plate member, a second pivot pin extending through said horizontal plate member at the other end thereof and into said third upright plate member to establish a second pivot axis perpendicular to said first pivot axis to accommodate said horizontal axis movement.

9. The apparatus of claim 8, wherein said open end of said hollow tubular member communicates with said one of said pair of axially-aligned port means through a flexible bellows means.

* * * * *